(12) United States Patent
Chen et al.

(10) Patent No.: US 11,139,187 B2
(45) Date of Patent: Oct. 5, 2021

(54) ADSORPTION DEVICE AND TRANSFERRING SYSTEM HAVING SAME

(71) Applicant: Century Technology (Shenzhen) Corporation Limited, Shenzhen (CN)

(72) Inventors: Po-Liang Chen, New Taipei (TW); Yung-Fu Lin, New Taipei (TW); Hirohisa Tanaka, Neihu (TW); Yasunori Shimada, Neihu (TW)

(73) Assignee: Century Technology (Shenzhen) Corporation Limited, Shenzhen (CN)

( * ) Notice: Subject to any disclaimer, the term of this patent is extended or adjusted under 35 U.S.C. 154(b) by 0 days.

(21) Appl. No.: 16/547,852

(22) Filed: Aug. 22, 2019

(65) Prior Publication Data
US 2021/0005488 A1    Jan. 7, 2021

(30) Foreign Application Priority Data

Jul. 5, 2019  (CN) .......................... 201910605359.4

(51) Int. Cl.
| | | |
|---|---|---|
| *H01L 21/673* | (2006.01) | |
| *B65G 47/92* | (2006.01) | |
| *H01F 7/02* | (2006.01) | |
| *H01F 41/02* | (2006.01) | |
| *H01L 33/00* | (2010.01) | |

(52) U.S. Cl.
CPC ........ *H01L 21/67336* (2013.01); *B65G 47/92* (2013.01); *H01F 7/02* (2013.01); *H01F 41/0253* (2013.01); *H01L 33/00* (2013.01)

(58) Field of Classification Search
CPC ...... H01L 21/67336; B65G 47/92; H01F 7/02
See application file for complete search history.

(56) References Cited

U.S. PATENT DOCUMENTS

| | | | | |
|---|---|---|---|---|
| 5,956,216 A | * | 9/1999 | Chou ..................... | B82Y 10/00 360/131 |
| 6,663,935 B1 | * | 12/2003 | Kashiwagi ............ | B29C 59/026 428/64.2 |
| 6,950,252 B2 | * | 9/2005 | Nishikawa ............. | B82Y 10/00 360/16 |
| 7,549,209 B2 | * | 6/2009 | Wachenschwanz ........................ | G11B 5/8404 29/603.01 |

(Continued)

FOREIGN PATENT DOCUMENTS

| | | |
|---|---|---|
| CN | 2689870 Y | 4/2005 |
| CN | 101396616 A | 4/2009 |

(Continued)

*Primary Examiner* — Minh N Trinh
(74) *Attorney, Agent, or Firm* — ScienBiziP, P.C.

(57) ABSTRACT

An adsorption device includes a substrate, a plurality of magnetic films, and a plurality of magnets. The substrate defines a plurality of receiving grooves spaced apart from each other. Each receiving groove defines a bottom wall and a side wall. Each magnetic film is in one receiving groove and covers the bottom wall and the side wall. The magnetic films are made of magnetic material. Each magnet is in one receiving groove. Each magnetic film is between the substrate and one magnet, a large number of magnetized LEDs of very small size are attracted on a one-to-one basis to the receiving grooves for transfer and placement of the LEDs onto a display panel which is in the course of being manufactured.

14 Claims, 8 Drawing Sheets

(56) References Cited

U.S. PATENT DOCUMENTS

| | | | | |
|---|---|---|---|---|
| 8,460,565 B2* | 6/2013 | Lee | ...................... | G11B 5/7379 |
| | | | | 216/22 |
| 8,900,655 B2* | 12/2014 | Yen | ........................ | G11B 5/656 |
| | | | | 427/127 |
| 2002/0160541 A1* | 10/2002 | Durcan | ................. | H01L 27/222 |
| | | | | 438/3 |
| 2004/0161576 A1* | 8/2004 | Yoshimura | ............. | G11B 5/865 |
| | | | | 428/846.2 |
| 2011/0151588 A1* | 6/2011 | Ashdown | ............ | H01L 21/6835 |
| | | | | 438/3 |

FOREIGN PATENT DOCUMENTS

| | | |
|---|---|---|
| CN | 106957798 A | 7/2017 |
| CN | 108682312 A | 10/2018 |
| CN | 208352323 U | 1/2019 |

* cited by examiner

ADSORPTION DEVICE AND TRANSFERRING SYSTEM HAVING SAME

FIELD

The subject matter herein generally relates to a field of manufacturing display panels, and particularly relates to an adsorption device, a method for making the adsorption device, and a transferring system having the adsorption device.

BACKGROUND

In a manufacturing process of a micro light emitting diode (LED) display device, a large number of LEDs are transferred to a substrate having a circuit. A known method of transferring is to adopt electrostatic attraction, that is, the LEDs to be transferred are held to a transferring substrate by static electricity, then the transferring substrate with the LEDs is moved above the substrate, and the static electricity is removed to make the LEDs drop onto the substrate. However, the electrostatic charge may damage the circuit on the substrate.

Therefore, there is room for improvement in the art.

BRIEF DESCRIPTION OF THE DRAWINGS

Implementations of the present technology will now be described, by way of embodiments only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as coupled, whether directly or indirectly through intervening components, and is not necessarily limited to physical connections. The connection can be such that the objects are permanently coupled or releasably coupled. The term "comprising" when utilized, means "including, but not necessarily limited to"; it specifically indicates open-ended inclusion or membership in the so-described combination, group, series, and the like.

Figure 1:
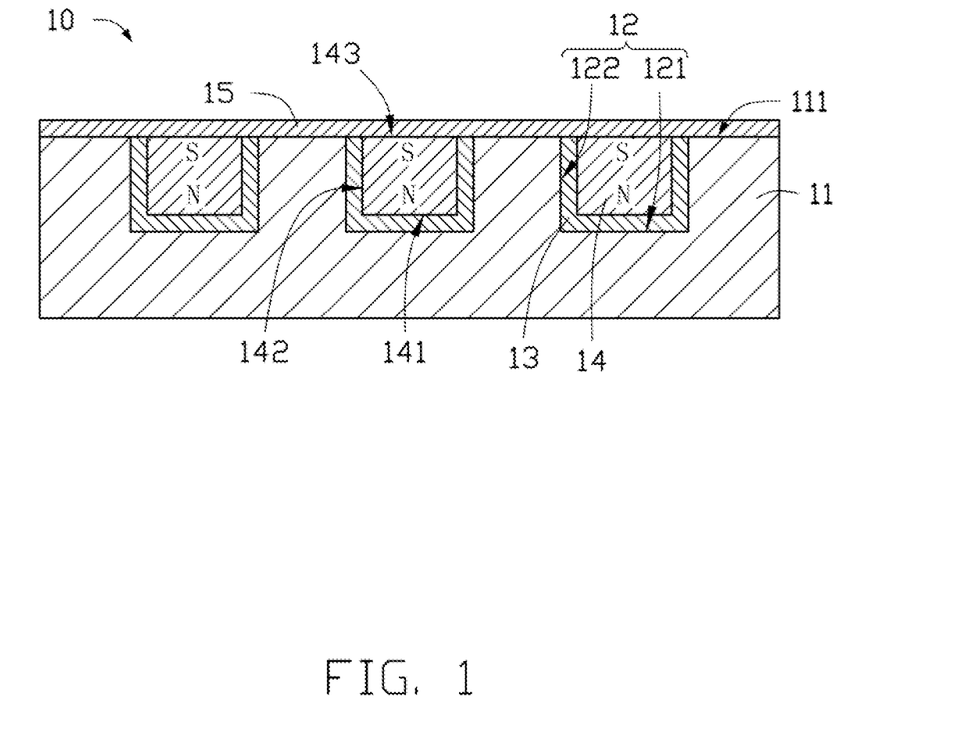
FIG. 1 is a cross-sectional view of an adsorption device according to an embodiment of the present disclosure.

Referring to FIG. 1, an adsorption device 10 includes a substrate 11. In this embodiment, the substrate 11 is an aluminum substrate. In other embodiments, the substrate 11 may be other rigid substrate. A plurality of receiving grooves 12 spaced apart from each other are defined on a surface 111 of the substrate 11. Each of the receiving grooves 12 has a bottom wall 121 and a side wall 122 coupling the bottom wall 121. In this embodiment, in order to simplify manufacturing process of the adsorption device 10, each receiving groove 12 has a same shape and a same size. The receiving grooves 12 are arranged in an array. In other embodiments, the receiving grooves 12 may have different shapes and different sizes, and the arrangement manner of the receiving grooves 12 may not be an array, for example, a single row.

As shown in FIG. 1, a magnetic film 13 is located in each receiving groove 12. Specifically, each magnetic film 13 completely covers the bottom wall 121 and the side wall 122 of the receiving groove 12. Thickness of the magnetic film 13 in each receiving groove 12 is constant. The magnetic film 13 is made of a magnetic material. In this embodiment, the magnetic film 13 is made of a ferromagnetic material or a ferrimagnetic material, such as one or more selected from a group consisted of iron, cobalt, and nickel.

As shown in FIG. 1, the adsorption device 10 further includes a plurality of magnets 14. Each magnet 14 is received in one of the receiving grooves 12 and partially covered by the magnetic film 13 in the groove 12. In this embodiment, each magnet 14 includes a bottom surface 141 facing the bottom wall 121, a top surface 143 opposite to the bottom surface 141, and a side surface 142 coupling between the bottom surface 141 and the top surface 143. Both the bottom surface 141 and the side surface 142 are covered by the magnetic film 13 in the receiving groove 12. The top surface 143 is exposed from the substrate 11.

Each magnet 14 is magnetic and generates a magnetic field. Each magnet 14 has a first magnetic pole adjacent to the bottom surface 141 and a second magnetic pole adjacent to the top surface 143. In this embodiment, the first magnetic pole is pole N, and the second magnetic pole is pole S. In other embodiments, the first magnetic pole is pole S, and the second magnetic pole is pole N. Since each magnet 14 is partially covered by the magnetic film 13, magnetic lines in the magnetic field generated by the magnet 14 are concentrated within the magnetic film 13 according to the characteristics of the magnetic film 13, so that magnetic force on the substrate 11 is concentrated in positions of each magnet 14. Moreover, the magnetic film 13 prevents magnetic fields generated by adjacent magnets 14 from affecting each other, thus the adsorption device 10 has a consistent adsorption effect.

The adsorption device 10 is configured to adsorb target objects 20 by generating magnetic force. Each magnet 14 in the adsorption device 10 forms an adsorbing position. The adsorption device 10 can absorb multiple target objects 20 in one single adsorption.

In the present embodiment, the magnet 14 is composed of magnetic powder. When the adsorption device 10 is used, the adsorption device 10 needs to be inverted such that the surface 111 of the substrate 11 faces downward. The magnetic powder in the receiving groove 12 may thus drop down from the receiving groove 12. Even if the magnet 14 is a solid block, it may easily drop from the receiving groove 12. In the present embodiment, the adsorption device 10 further includes a protective film 15 to cover the receiving groove 12, thus the magnet 14 cannot drop down from the receiving groove 12. The protective film 15 covers the top surface 143 of each magnet 14. In the present embodiment, the protective film 15 is an entire and continuous layer on the surface 111 of the substrate 11. In other embodiments, the protective film 15 may non-continuous layer and include many portions spaced apart from each other, each portion covers one of the receiving grooves 12. Each portion may have an area slightly larger than the top surface 143 of each magnet 14. In this embodiment, the protective film 15 is made of resin.

Figure 2:
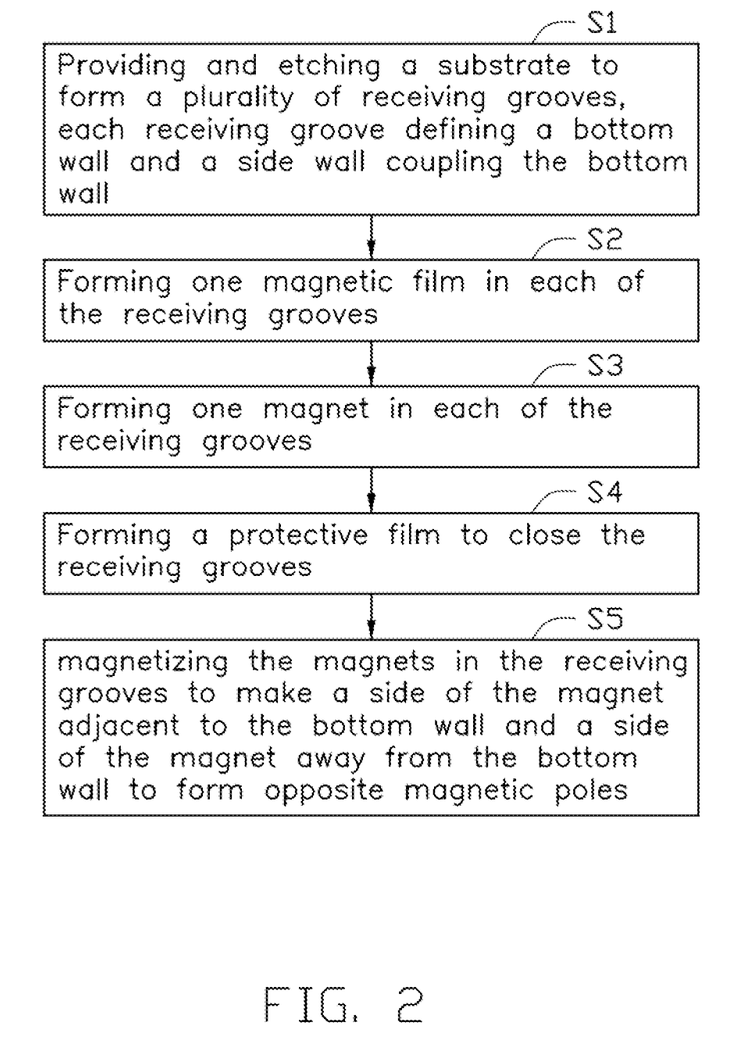
FIG. 2 is a flowchart showing a method for making the adsorption device.
Figure 5:
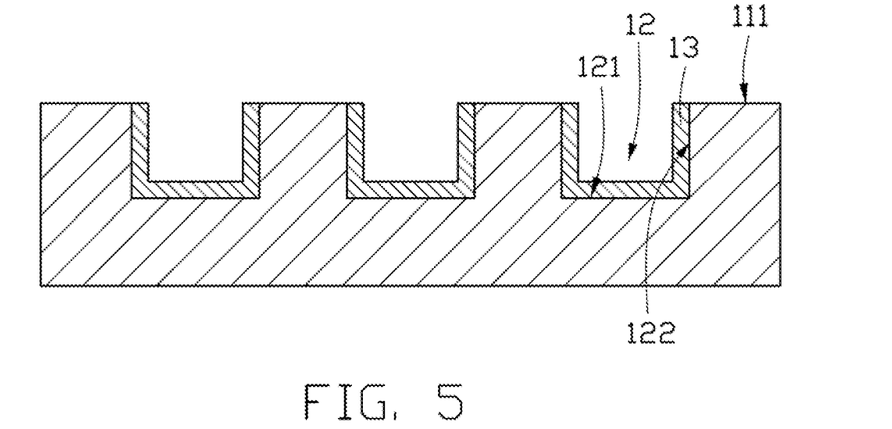
FIG. 5 is another embodiment of a cross-sectional view illustrating a step S2 of the method for making the adsorption device in FIG. 2.

FIG. 2 illustrates a flowchart of a method for making an adsorption device. The example method is provided by way of example, as there are a variety of ways to carry out the method. Each block shown in FIG. 5 represents one or more processes, methods, or subroutines, carried out in the exemplary method. Furthermore, the illustrated order of blocks is by example only and the order of the blocks can change. The exemplary method can begin at block S1 according to the present disclosure. Depending on the embodiment, additional steps can be added, others removed, and the ordering of the steps can be changed.

At block S1: a substrate is provided and etched to form a plurality of receiving grooves.

Figure 3:
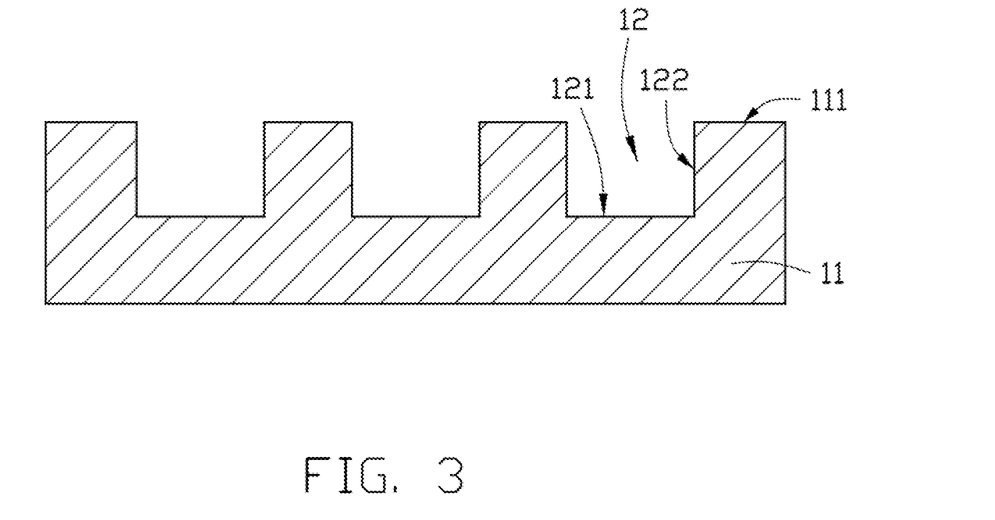
FIG. 3 is a cross-sectional view illustrating a step S1 of the method for making the adsorption device in FIG. 2.

A rectangular substrate (not shown) is provided and a surface 111 of the rectangular substrate is etched to form the plurality of receiving grooves 12, as shown in FIG. 3. The substrate 11 can be etched by laser. As shown in FIG. 3, each receiving grooves 12 defines a bottom wall 121 and a side wall 122 coupling the bottom wall 121.

At block S2: a magnetic film is formed in each receiving groove, the film is in direct contact with wall of the receiving groove.

Figure 4:
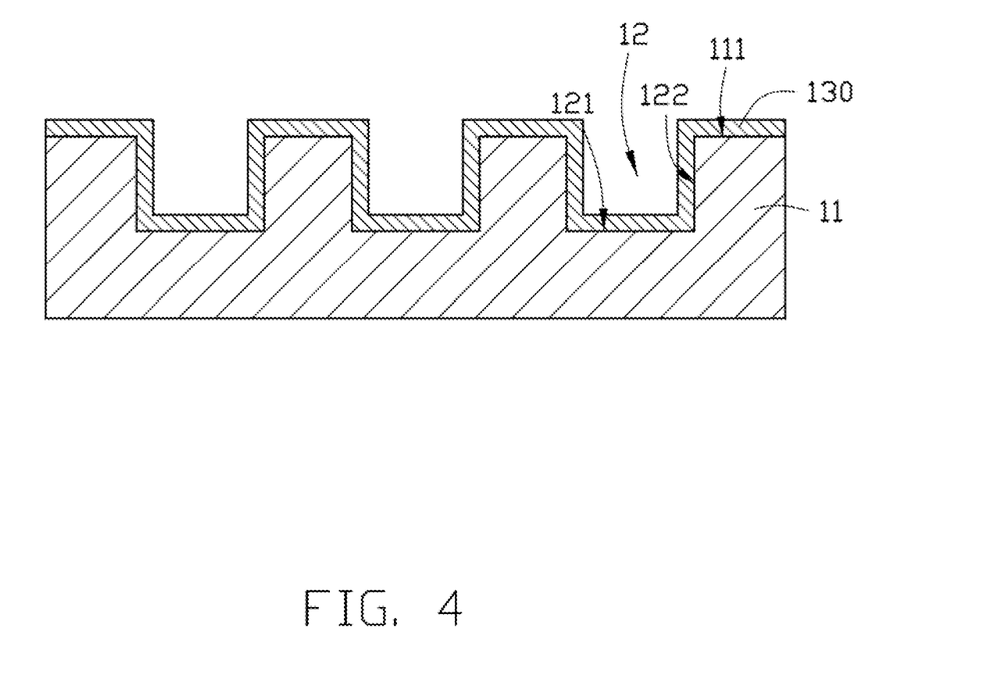
FIG. 4 is a cross-sectional view illustrating a step S2 of the method for making the adsorption device in FIG. 2.

As shown in FIG. 4, a magnetic film 13 is formed on the surface 111 and in the receiving groove 12; the magnetic film 13 covers the bottom wall 121 and the side wall 122 of each receiving groove 12. As shown in FIG. 5, the magnetic film 13 is etched and a portion of the magnetic film 13 that covers the surface 111 is removed. Only the portion of the magnetic film 13 which is in the receiving grooves 12 is allowed to remain.

At block S3: a magnet is positioned in each receiving groove and covered by the magnetic film.

Figure 6:
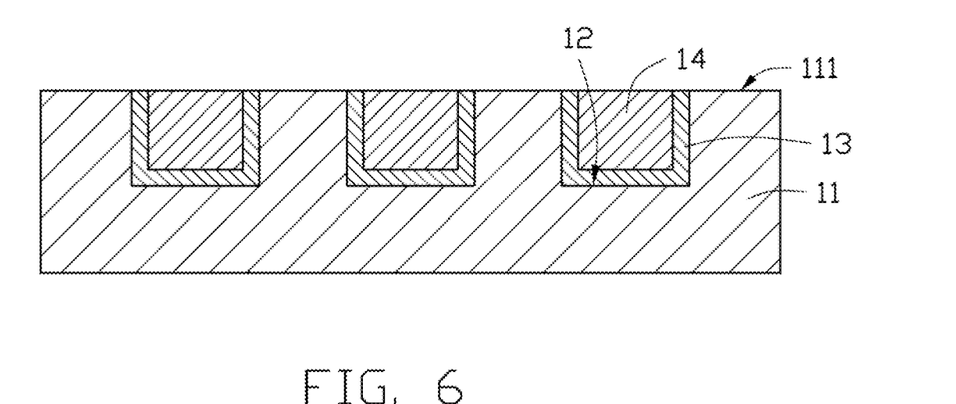
FIG. 6 is a cross-sectional view illustrating a step S3 of the method for making the adsorption device in FIG. 2.

As shown in FIG. 6, one magnet 14 is formed in each receiving groove 12 and is covered by the magnetic film 13. The magnet 14 is flush with the surface 111. In one embodiment, the magnet 14 is composed of magnetic powder; the magnetic powder infills each receiving groove 12.

At block S4: a protective film is formed on the substrate to close off the receiving grooves.

Figure 7:
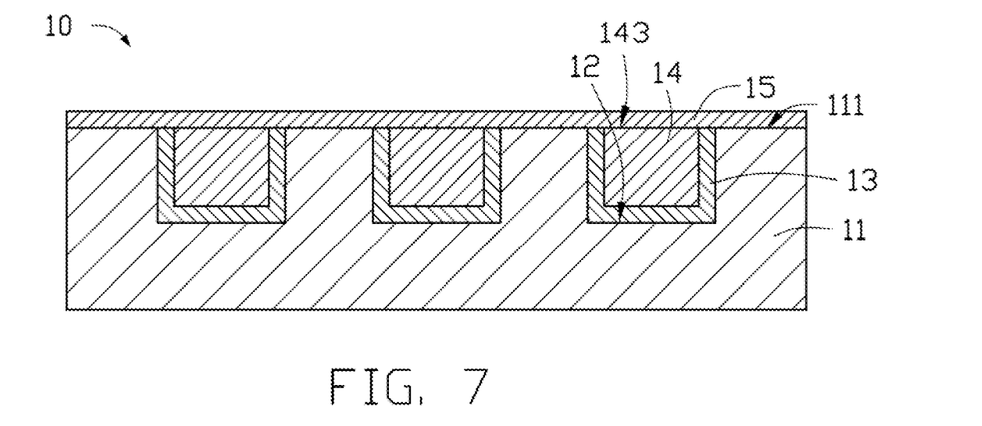
FIG. 7 is a cross-sectional view illustrating a step S4 of the method for making the adsorption device in FIG. 2.

As shown in FIG. 7, in order to prevent the magnets 14 dropping from the receiving groove 12, a protective film 15 is formed on the surface 111 of the substrate. The protective film 15 covers each receiving groove 12. The protective film 15 can be made of resin.

At block S5: the magnet in each receiving groove is magnetized such that a side of the magnet adjacent to the protective film and a side of the magnet away from the protective film form opposite magnetic poles.

Figure 8:
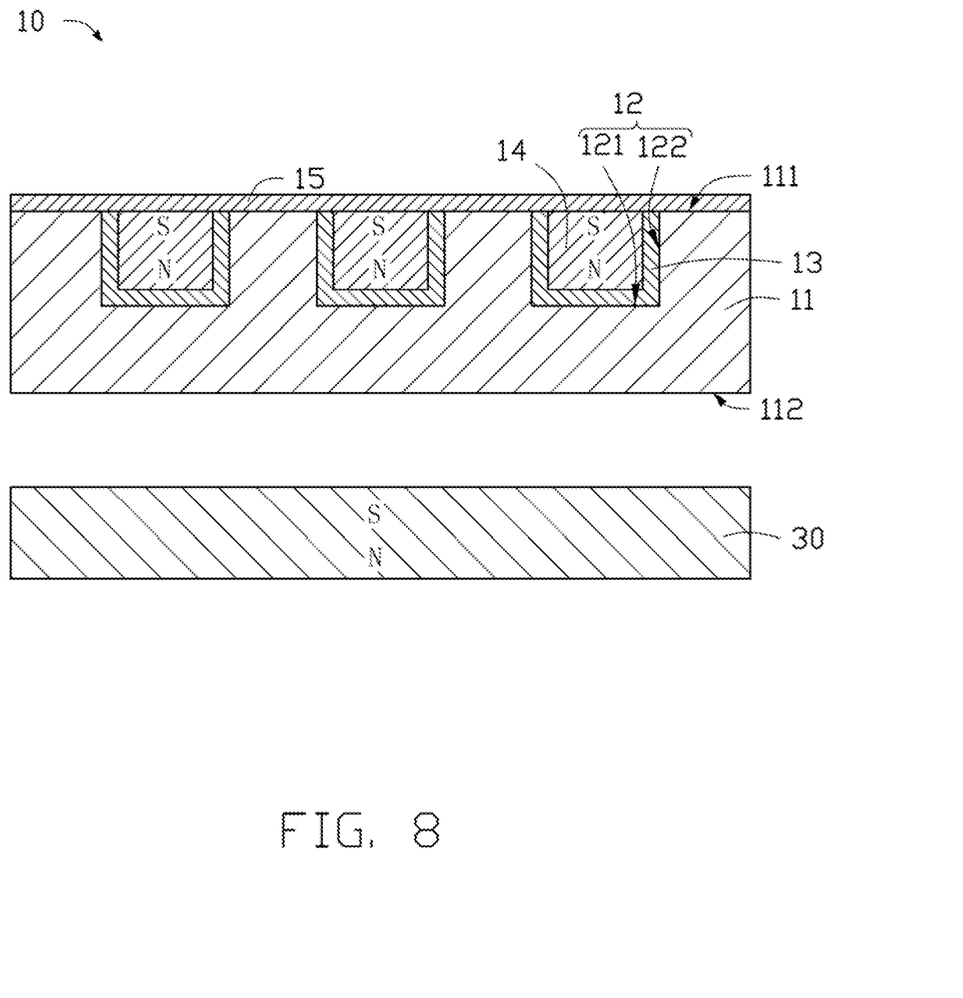
FIG. 8 is a cross-sectional view illustrating a step S5 of the method for making the adsorption device in FIG. 2.

As shown in FIG. 8, since magnetic poles of the magnets 14 placed in the step S3 are irregular, the magnetic poles of the magnets 14 need to be magnetized. The magnetic poles of each magnet 14 are adjusted so that a side of each magnet 14 adjacent to the bottom wall 121 of the receiving groove 12 and another side of each magnet 14 away from the bottom wall 121 form opposite magnetic poles. In this embodiment, the side of each magnet 14 adjacent to the bottom wall 121 is arranged to be a magnetic pole N; and the side of each magnet 14 away from the bottom wall 121 is thus a magnetic pole S.

As shown in FIG. 8, the magnetic poles of the magnets 14 is magnetized by a permanent magnet 30 having two opposite magnetic poles N and S. One of the magnetic poles N and S of the permanent magnet 30 is facing a surface 112 of the substrate 11 opposite to the surface 111 for a predetermined period of time to magnetize the magnets 14. In this embodiment, the magnetic pole S of the permanent magnet 30 is kept facing the surface 112 of the substrate 11.

Figure 9:
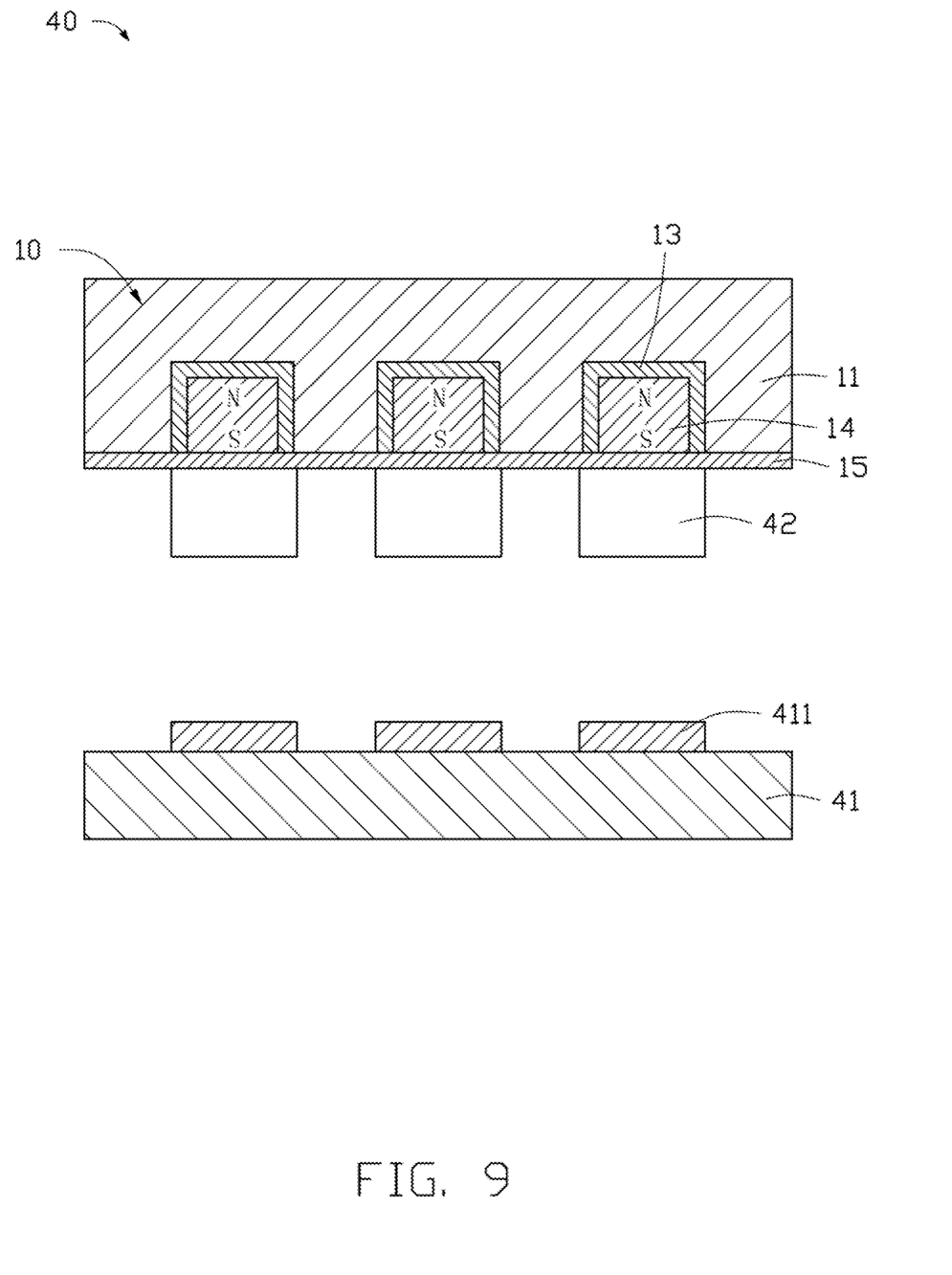
FIG. 9 is a cross-sectional view of a transferring system according to an embodiment of the present disclosure.

As shown in FIG. 9, a transferring system 40 includes the adsorption device 10 and a target substrate 41. In this embodiment, the transferring system 40 is used to complete the transfer of a large number of LEDs 42 during a manufacturing process of the display panel. The transferring system 40 is used to transfer a large number of LEDs 42 in a single transfer. The LEDs 42 can be, for example, a mini LED, a micro LED, and a conventional size LED. The mini LED described herein refers to a sub-millimeter-level LED having a size of about 100 μm to 200 μm or more; a micro LED refers to an LED having a size of 100 μm or less.

In this embodiment, the target substrate 41 is an active substrate/array substrate of a display panel. The target substrate 41 defines a plurality of pixel regions, and each of the magnetic units 12 corresponds to one pixel region. A plurality of small spots of anisotropic conductive adhesive 411 are arranged in an array on the target substrate 41, and each spot of anisotropic conductive adhesive 411 is located in one of the pixel regions. A working process of the transferring system 40 is as follows.

As shown in FIG. 9, a surface 111 of the substrate 11 having the protective film 15 faces the LEDs 42. The LED 42 is made of a material having magnetic properties or the LED 42 contains magnetic particles, and the LEDs 42 have a magnetic pole different from that of the magnetic pole of the magnet 14 adjacent to the protective film 15. Thus, the LED 42 is subjected to a magnetic force in a direction toward the adsorption device 10 (arrow shown in FIG. 10) and is attracted by the magnet 14. Since the plurality of magnets 14 is formed on the substrate 11 and each magnet 14 can attract one LED 42, the adsorption device 10 can adsorb multiple LEDs 42 in a single time. In a manufacturing process of the display panel, the adsorption device 10 can attract and hold tens of thousands of LEDs 42.

Figure 10:
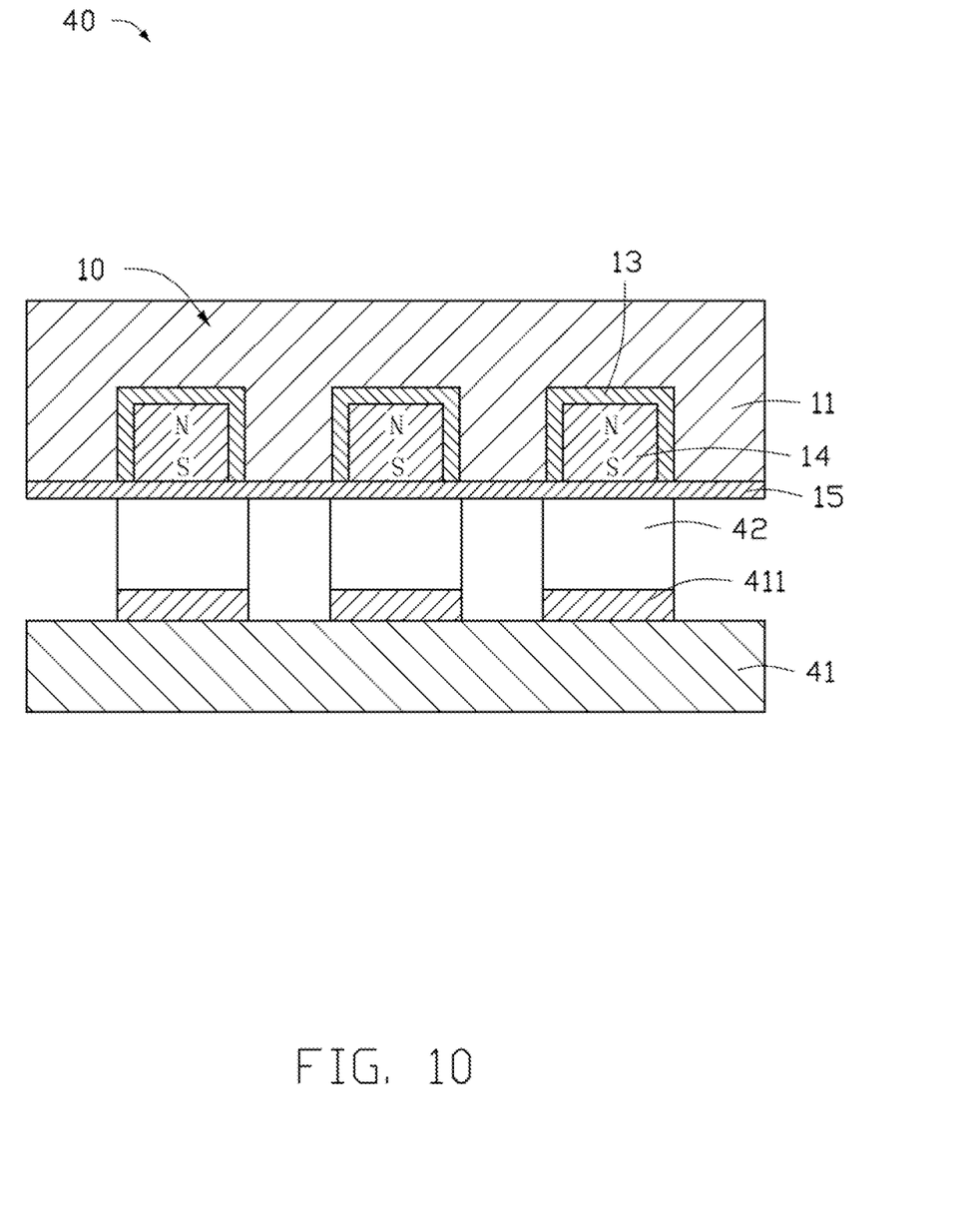
FIG. 10 is a cross-sectional view showing the transferring system of FIG. 9 in a working state.

As shown in FIG. 10, the adsorption device 10 is moved above the target substrate 41 or the target substrate 41 is moved under the adsorption device 10, and the LEDs 42 attracted by the adsorption device 10 are in one-to-one correspondence with the spots of anisotropic conductive adhesive 411 on the target substrate 41. Each LED 42 contacts one spot of anisotropic conductive adhesive 411. Further, the anisotropic conductive adhesive 411 is thermally cured or UV-cured so that the LEDs 42 are adhered to the spots of anisotropic conductive adhesive 411 in one-to-one correspondence.

Figure 11:
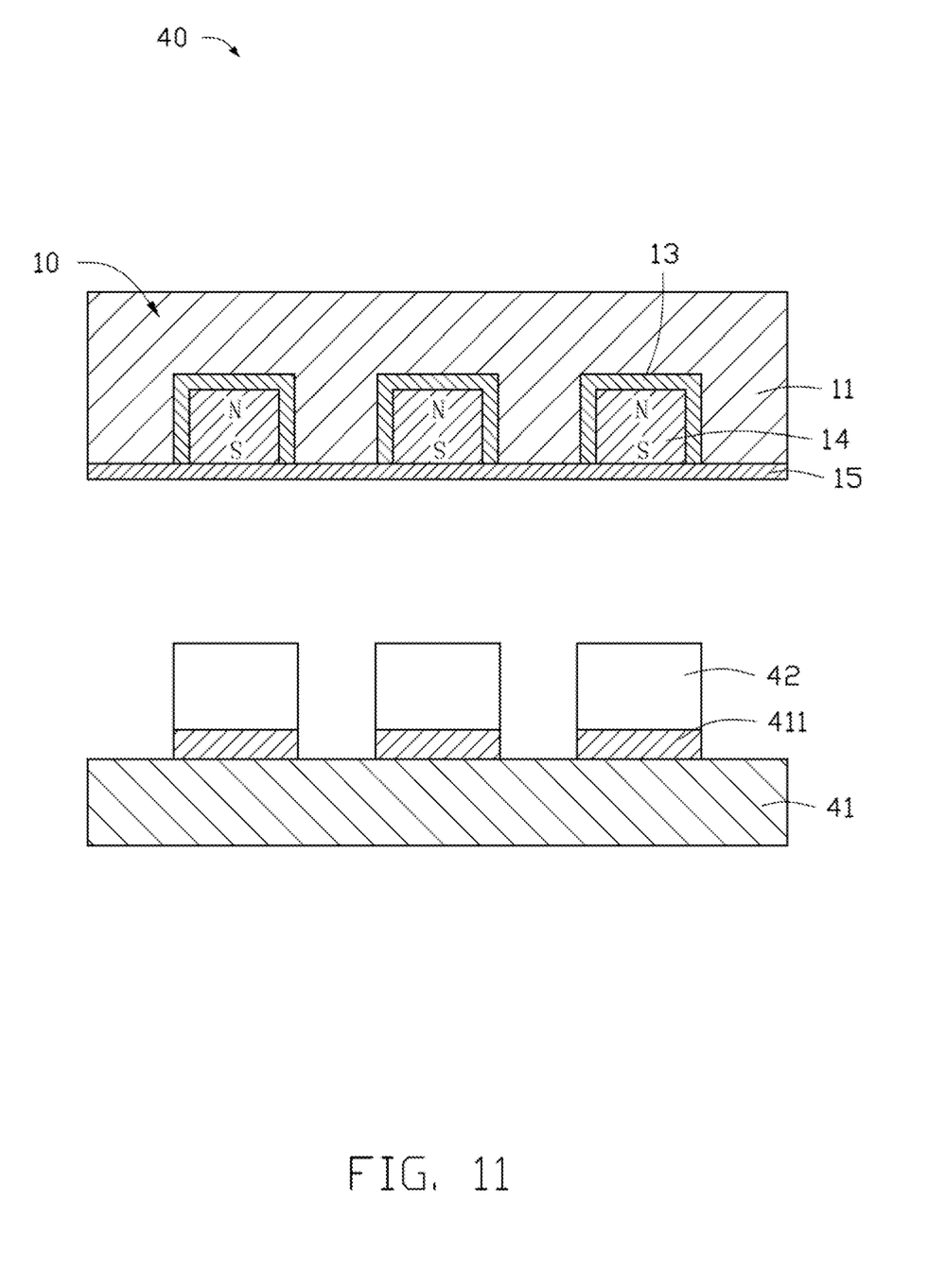
FIG. 11 is another cross-sectional view showing the transferring system of FIG. 9 in a working state.

As shown in FIG. 11, an adhesion force between the LED 42 and the anisotropic conductive adhesive 411 is greater than the magnetic attraction of the LED 42 to the adsorption device 10. When the adsorption device 10 is moved away from the target substrate 41, the LED 42 will separate from the adsorption device 10 and be fixed to the target substrate 41.

As described above, a large number of LEDs 42 can be transferred onto the target substrate 41 at one time. Especially when the size of the LED 42 is small (such as mini LEDs and Micro LEDs), the above transferring system 40 can improve manufacturing efficiency of the display panel.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. An adsorption device configured to adsorb light emitting diodes, comprising:
    a substrate, the substrate defining a plurality of receiving grooves spaced apart from each other, each of the receiving grooves defining a bottom wall and a side wall coupling the bottom wall;
    a plurality of magnetic films having a same thickness, each of the plurality of magnetic film being in one of the plurality of receiving grooves and covering the bottom wall and the side wall, the plurality of magnetic films being made of magnetic material; and
    a plurality of magnets each including a bottom surface facing the bottom wall, a top surface opposite to the bottom surface, and a side surface coupling between the bottom surface and the top surface, each of the plurality of magnets being in one of the plurality of receiving grooves, each of the plurality of magnetic films being between the substrate and a corresponding one of the plurality of magnets.

2. The adsorption device of claim 1, wherein a side of each of the plurality of magnets adjacent to the bottom wall and a top side of each of the plurality of magnets away from the bottom wall form opposite magnetic poles.

3. The adsorption device of claim 1, further comprising a protective film, wherein the protective film covers the plurality of receiving grooves.

4. The adsorption device of claim 3, wherein the protective film is made of resin.

5. The adsorption device of claim 1, wherein the magnetic film is made of a ferromagnetic material or a ferrimagnetic material.

6. The adsorption device of claim 5, wherein the magnetic film is made of one or more selected from a group consisted of iron, cobalt, and nickel.

7. The adsorption device of claim 1, wherein each of the plurality of magnets is composed of magnetic powder.

8. A transferring system, comprising:
    an adsorption device configured to adsorb light emitting diodes, the adsorption device comprising:
        a substrate, the substrate defining a plurality of receiving grooves spaced apart from each other, each of the receiving grooves defining a bottom wall and a side wall coupling the bottom wall;
        a plurality of magnetic films having a same thickness, each of the plurality of magnetic film being in one of the plurality of receiving grooves and covering the bottom wall and the side wall, the plurality of magnetic films being made of magnetic material; and
        a plurality of magnets each including a bottom surface facing the bottom wall, a top surface opposite to the bottom surface, and a side surface coupling between the bottom surface and the top surface, each of the plurality of magnets being in one of the plurality of receiving grooves, each of the plurality of magnetic film being between the substrate and one of the plurality of magnets;
    a target substrate, a plurality of spots of anisotropic conductive adhesive being on the target substrate and configured to fix the light emitting diodes on the target substrate from the adsorption device.

9. The transferring system of claim 8, wherein a side of each of the plurality of magnets adjacent to the bottom wall and a top side of each of the plurality of magnets away from the bottom wall form opposite magnetic poles.

10. The transferring system of claim 8, further comprising a protective film, wherein the protective film covers the plurality of receiving grooves.

11. The transferring system of claim 10, wherein the protective film is made of resin.

12. The transferring system of claim 8, wherein the magnetic film is made of a ferromagnetic material or a ferrimagnetic material.

13. The transferring system of claim 12, wherein the magnetic film is made of one or more selected from a group consisted of iron, cobalt, and nickel.

14. The transferring system of claim 8, wherein each of the plurality of magnets is composed of magnetic powder.

* * * * *